US011152776B2

(12) United States Patent
Hauer

(10) Patent No.: US 11,152,776 B2
(45) Date of Patent: Oct. 19, 2021

(54) OVERCURRENT AND SHORT-CIRCUIT DETECTOR

(71) Applicant: Eaton Intelligent Power Limited, Dublin (IE)

(72) Inventor: Wolfgang Hauer, Vorderweissenbach (AT)

(73) Assignee: EATON INTELLIGENT POWER LIMITED, Dublin (IE)

(*) Notice: Subject to any disclaimer, the term of this patent is extended or adjusted under 35 U.S.C. 154(b) by 210 days.

(21) Appl. No.: 16/469,718

(22) PCT Filed: Dec. 15, 2017

(86) PCT No.: PCT/EP2017/083007
§ 371 (c)(1),
(2) Date: Jun. 14, 2019

(87) PCT Pub. No.: WO2018/109161
PCT Pub. Date: Jun. 21, 2018

(65) Prior Publication Data
US 2019/0353689 A1 Nov. 21, 2019

(30) Foreign Application Priority Data

Dec. 16, 2016 (DE) .................... 10 2016 124 638.7

(51) Int. Cl.
*G01R 19/165* (2006.01)
*H02H 1/00* (2006.01)
(Continued)

(52) U.S. Cl.
CPC ......... *H02H 1/04* (2013.01); *G01R 19/16528* (2013.01); *G01R 31/52* (2020.01); *H02H 1/0007* (2013.01); *H02H 3/10* (2013.01)

(58) Field of Classification Search
CPC ........ G01R 19/16528; G01R 19/16547; G01R 31/025; G01R 31/50; G01R 31/52;
(Continued)

(56) References Cited

U.S. PATENT DOCUMENTS 3,657,605 A 4/1972 Hill
3,970,901 A 7/1976 Rohr
(Continued)

FOREIGN PATENT DOCUMENTS

DE 1063696 A 8/1959
DE 3642136 C2 2/1993
(Continued)

*Primary Examiner* — Jared Fureman
*Assistant Examiner* — Nicolas Bellido
(74) *Attorney, Agent, or Firm* — Leydig, Voit & Mayer, Ltd.

(57) ABSTRACT

An overcurrent and/or short-circuit detector includes: at least one current sensor for picking up a current signal which has a predeterminable time resolution in at least one electrical current path; and at least one evaluation unit. The at least one evaluation unit: determines a first point in time of a predeterminable steep increase in the current signal, forms a temporal integral of current values of the current signal from the first point in time to a second point in time, compares a pair of values, including a relevant value of the integral and the relevant value of the current signal, with at least one predeterminable limiting condition at predeterminable temporal intervals substantially continuously, and emits an overcurrent and/or short-circuit signal to an outlet of the overcurrent and/or short-circuit detector if the pair of values exceeds a limiting condition.

5 Claims, 1 Drawing Sheet

(51) Int. Cl.
*H02H 3/10* (2006.01)
*H02H 1/04* (2006.01)
*G01R 31/52* (2020.01)

(58) Field of Classification Search
CPC .......... H02H 1/0007; H02H 1/04; H02H 3/05;
H02H 3/08; H02H 3/087; H02H 3/093;
H02H 3/10; H02H 3/44; H02H 3/445
See application file for complete search history.

(56) References Cited

U.S. PATENT DOCUMENTS

| | | | | |
|---|---|---|---|---|
| 5,831,807 | A * | 11/1998 | Masannek | H02H 7/1227 361/93.2 |
| 6,313,639 | B1 | 11/2001 | Griepentrog | |
| 7,227,729 | B2 * | 6/2007 | Parker | H02H 1/0015 361/42 |

FOREIGN PATENT DOCUMENTS

| | | | | |
|---|---|---|---|---|
| DE | 19729599 | C1 | 2/1999 | |
| DE | 102006019467 | A1 * | 10/2007 | G01R 31/52 |
| DE | 102006025607 | A1 | 11/2007 | |
| DE | 102007006564 | A1 | 8/2008 | |
| DE | 102010042609 | A1 | 4/2012 | |
| DE | 102014111220 | A1 * | 2/2016 | G01R 31/14 |
| EP | 1772936 | A2 | 4/2007 | |

* cited by examiner

OVERCURRENT AND SHORT-CIRCUIT DETECTOR

CROSS-REFERENCE TO PRIOR APPLICATIONS

This application is a U.S. National Phase application under 35 U.S.C. § 371 of International Application No. PCT/EP2017/083007, filed on Dec. 15, 2017, and claims benefit to German Patent Application No. DE 10 2016 124 638.7, filed on Dec. 16, 2016. The International Application was published in German on Jun. 21, 2018 as WO 2018/109,161 under PCT Article 21(2).

FIELD

The invention relates to an overcurrent and/or short-circuit detector.

BACKGROUND

What are referred to as "2-D locus curves" are known for the purpose of detecting overcurrents and/or short-circuits. In this case, in addition to an instantaneous value of the current at a specific point in time, the first derivative thereof with respect to time is included in the assessment. What are referred to as "3-D locus curves" are also known, in which case the second derivative with respect to time is included in the assessment.

These known algorithms, and the implementation thereof in circuits, are disadvantageous in that they have a tendency to trigger unnecessarily, in that they detect events or current flows which are unproblematic per se as an overcurrent and/or a short-circuit current. In particular in the case of capacitive starting currents, or other, in particular very steep, current spikes, these algorithms detect an overcurrent and/or a short-circuit and cause an unnecessary disconnection from the mains power supply. Disconnections of this kind can lead to interruptions in production processes, and to data losses. They can also cause complex service or maintenance works, in that an electrician will search for the cause of this disconnection from the mains power supply, but will be unable to find one as the cause is the circuit breaking device, and the mains power supply and devices connected thereto are otherwise functioning properly. This can also lead to the replacement of operationally reliable devices, insofar as these were identified as the perceived source of the error.

SUMMARY

In an embodiment, the present invention provides an overcurrent and/or short-circuit detector, comprising: at least one current sensor configured to pick up a current signal which has a predeterminable time resolution in at least one electrical current path; and at least one evaluation unit, the at least one evaluation unit being configured to: determine a first point in time of a predeterminable steep increase in the current signal, form a temporal integral of current values of the current signal from the first point in time to a second point in time, compare a pair of values, comprising a relevant value of the integral and the relevant value of the current signal, with at least one predeterminable limiting condition at predeterminable temporal intervals substantially continuously, and emit an overcurrent and/or short-circuit signal to an outlet of the overcurrent and/or short-circuit detector if the pair of values exceeds a limiting condition.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention provides an overcurrent and/or short-circuit detector of the type mentioned at the outset, by means of which the aforementioned disadvantages can be avoided, and by means of which it is possible to detect overcurrents and/or short-circuits in a manner which is reliable and resistant to triggering erroneously.

As a result, an overcurrent and/or short-circuit can be detected in a manner which is resistant to erroneous detections due to transient processes, which reliably detects overcurrents and/or short-circuits, and which is simple to implement. As a result, the mains power supply availability can be increased. As a result, the effort which is used in searching for errors can be reduced.

The invention also relates to a circuit breaking device comprising an overcurrent and/or short-circuit detector according to the invention.

The invention also relates to a method for detecting an overcurrent and/or short-circuit, which method achieves the above object, and also results in the aforementioned advantages.

Figure 1:
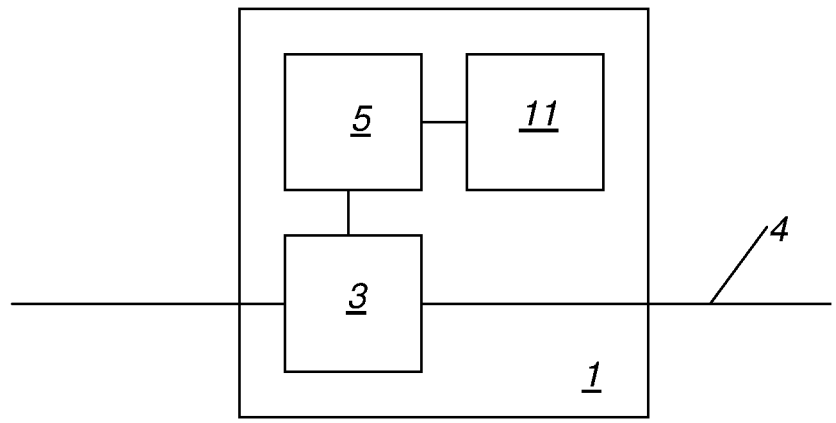
FIG. 1 is a block diagram of an overcurrent and/or short-circuit detector according to the invention.

FIG. 1 shows an overcurrent and/or short-circuit detector 1, in particular for a circuit breaking device 2, comprising at least one current sensor 3 for picking up a current signal which has a predeterminable time resolution in at least one electrical current path 4, and at least one evaluation unit 5.

The overcurrent and/or short-circuit detector 1 is provided to monitor at least one electrical current path 4 or electrical conductor. Overcurrent and/or short-circuit detectors 1 can also be designed for a predeterminable plurality of electrical current paths 4 in particular.

The overcurrent and/or short-circuit detector 1 has at least one current sensor 3 per current path, which sensor can be designed so as to comprise a shunt, a Hall sensor, and/or a Förster probe, for instance, or as a different sensor. The current sensor 3 is designed to pick up a temporal current flow, and has a predeterminable time resolution. As, according to the invention, the behavior of the current over time is analyzed, and transient processes are to be detected, the current sensor 3 preferably has a temporal resolution of better than or less than 125 µs, corresponding to a sampling rate of 8 kHz in a digital embodiment of the current sensor 3. A sampling rate of at least 20 kHz, corresponding to a time resolution of 50 µs, is particularly preferable.

The overcurrent and/or short-circuit detector 1 also has an evaluation unit 5, which is connected to the current sensor 3 by telecommunication, in particular by way of a circuit. The evaluation unit 5 is preferably designed so as to comprise a micro-controller, it being possible for this unit to also be formed entirely in hardware, or by means of a programmable logic circuit.

The evaluation unit 5 is designed to determine a first point in time of a predeterminable steep increase in the current signal. The corresponding derivative, which is a measurement of the steepness of an increase, is formed for this purpose. What is referred to as the slew rate is also determined. The steepness of the increase is compared with a limit value. When the steepness of the increase exceeds the limit value, the possibility of an overcurrent and/or a short-circuit is considered to be present, and the current flow is analyzed. In this case, a timer is started when the possible overcurrent and/or short-circuit occurs. The point in time in question is defined as the first point in time.

The evaluation unit 5 subsequently forms the temporal integral of the current values of the current signal from the first point in time to a second point in time which follows the first. In this case, the second point in time is preferably at most one cycle duration of an applied mains power frequency after the first point in time. At a mains power frequency of 50 Hz, the second point in time is at most 20 ms after the first point in time. In selected cases, the interval between the first and second point in time can also be longer.

The evaluation unit 5 continuously forms the integral. The relevant value of the integral after a specific period of time is combined with the value of the current signal for the period of time concerned to form a pair of values. This pair of values is compared with at least one predeterminable limiting condition by means of the evaluation unit 5.

The formation of the pair of values and the comparison thereof with the limiting condition preferably takes place substantially continuously, with this comparison in particular taking place in a manner which corresponds to the sampling rate of the current sensor 3.

Figure 3:
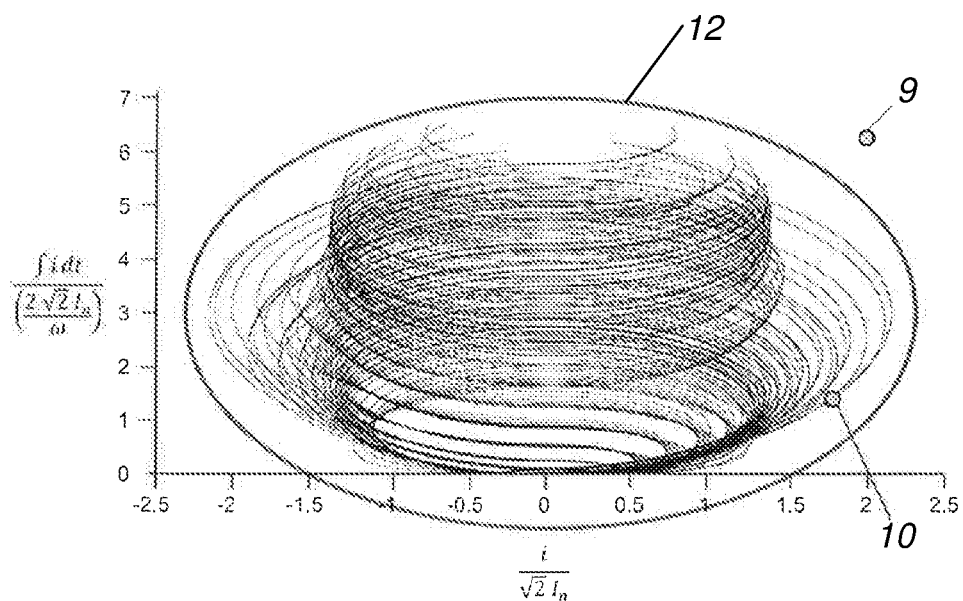
FIG. 3 is a schematic representation of a course of a pair of values according to the invention, together with the limiting condition, which is represented graphically.

FIG. 3 shows a graphic representation of possible values of the pair of values. The set of curves plotted in the process, which corresponds to a depiction of a cyclone, consists of a plurality of curves, with each of the curves being what is referred to as a locus curve and representing a possible current flow. As each of the individual curves concerned is situated within the bordering ellipse, they are also allowed or permissible current flows.

In FIG. 3 the current value i at a specific point in time, normalized to a peak value of the nominal current $I_N$ of a system to be monitored, such as 16A, is plotted on the x axis. On the y axis, however, the integral of the relevant current value i, normalized to the integral of the nominal current $I_N$, is plotted by means of a sine wave, where ω is the mains power frequency in a manner known per se.

The limiting condition is in particular as follows:

$$(\int i - y_0)^2/a^2 + (i-x_0)^2/b^2 \leq 1$$

This equation defines an ellipse 12. This is plotted in FIG. 3.

When comparing the pair of values with the limiting condition, it is therefore determined whether the pair of values, when considered graphically, are situated inside or outside the ellipse. If the pair of values are always situated inside the ellipse, or limiting condition, for the duration of the possible overcurrent and/or short-circuit event, then there is no overcurrent and/or short-circuit. Reference numeral 10 constitutes an example of one such pair of values for which there was no overcurrent and/or short-circuit. As soon as the pair of values leaves the ellipse however, and in this way breaches or no longer meets the limiting condition, there is an overcurrent and/or short-circuit. Reference numeral 9 constitutes an example of one such pair of values for which there was a short-circuit.

In the case of a pair of values exceeding or breaching the limiting condition, therefore, by means of the combination of both values, the overcurrent and/or short-circuit detector 1 emits an overcurrent and/or short-circuit signal to an outlet 11 of the overcurrent and/or short-circuit detector 1. For this purpose, the evaluation unit 5 is connected to the outlet 11. The outlet 11 itself can be both electric and mechanical.

In a method for detecting overcurrents and/or short-circuits, accordingly, a current signal which has a predeterminable time resolution can be picked up in an electrical current path 4, wherein subsequently:

a first point in time of a predeterminable steep increase in the current signal is determined, wherein a temporal integral of the current values of the current signal from the first point in time to a second point in time is formed, wherein a pair of values, consisting of a relevant value of the integral and the relevant value of the current signal, are compared with at least one predeterminable limiting condition at predeterminable temporal intervals, in particular substantially continuously, and wherein, in the case of the pair of values exceeding the limiting condition, an overcurrent and/or short-circuit signal is emitted.

With regard to preferred embodiment features of the individual method steps, the corresponding embodiments can be applied to the overcurrent and/or short-circuit detector 1.

Figure 2:
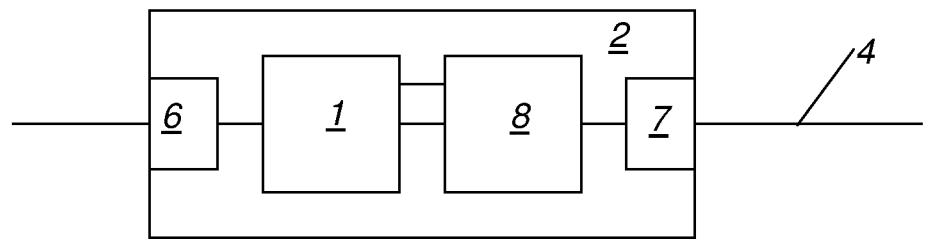
FIG. 2 is a block diagram of a circuit breaking device according to the invention.

FIG. 2 is a block diagram of a circuit breaking device 2, and depicts merely a single electrical current path 4 from a first terminal 6 of the circuit breaking device 2 to a second terminal 7 of the circuit breaking device 2, it being possible for the circuit breaking device 2 to also have a larger number of current paths 4 and terminals 6, 7.

The circuit breaking device 2 has an overcurrent and/or short-circuit detector 1 according to the invention. The circuit breaking device 2 is designed to interrupt the current path 4 following an overcurrent and/or short-circuit signal from the overcurrent and/or short-circuit detector 1. For this purpose, the circuit breaking device 2 has a corresponding interruption unit 8, which can be formed by means of a switch lock and mechanical contacts, by means of hybrid switching technology, or as a pure solid state interrupter.

The overcurrent and/or short-circuit detector 1 is connected to the interruption unit 8.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An overcurrent and/or short-circuit detector, comprising:
   at least one current sensor configured to pick up a current signal which has a predeterminable time resolution in at least one electrical current path; and
   at least one evaluation unit, the at least one evaluation unit being configured to:
      determine a first point in time of a predeterminable steep increase in the current signal,
      form a temporal integral of current values of the current signal from the first point in time to a second point in time,
      compare a pair of values, comprising a relevant value of the integral and the relevant value of the current signal, with at least one predeterminable limiting condition at predeterminable temporal intervals substantially continuously, and
      emit an overcurrent and/or short-circuit signal to an outlet of the overcurrent and/or short-circuit detector if the pair of values exceeds a limiting condition.

2. A circuit breaking device, comprising:
   at least one electrical current path from a first terminal of the circuit breaking device to a second terminal of the circuit breaking device; and
   the overcurrent and/or short-circuit detector according to claim 1,
   wherein the circuit breaking device is configured to interrupt the current path following an overcurrent and/or short-circuit signal from the overcurrent and/or short-circuit detector.

3. A method for detecting an overcurrent and/or short-circuit when a current signal which has a predeterminable time resolution is picked up in an electrical current path, comprising:
   determining a first point in time of a predeterminable steep increase in the current signal;
   forming a temporal integral of current values of the current signal from the first point in time to a second point in time;
   comparing a pair of values, comprising a relevant value of the integral and the relevant value of the current signal, with at least one predeterminable limiting condition at predeterminable temporal intervals substantially continuously; and
   emitting an overcurrent and/or short-circuit signal if the pair of values exceeds a limiting condition.

4. An overcurrent and/or short-circuit detector, comprising:
   at least one current sensor configured to pick up a current signal which has a predeterminable time resolution in at least one electrical current path; and
   at least one evaluation unit, the at least one evaluation unit being configured to:
      determine a first point in time of a predeterminable steep increase in the current signal,
      form a temporal integral of current values of the current signal from the first point in time to a second point in time,
      compare a pair of values, comprising a relevant value of the integral and the relevant value of the current signal, with at least one predeterminable limiting condition at predeterminable temporal intervals substantially continuously, and
      emit an overcurrent and/or short-circuit signal to an outlet of the overcurrent and/or short-circuit detector if the pair of values exceeds a limiting condition,
   wherein the second point in time is at most one cycle duration of an applied mains power frequency after the first point in time.

5. An overcurrent and/or short-circuit detector, comprising:
   at least one current sensor configured to pick up a current signal which has a predeterminable time resolution in at least one electrical current path; and
   at least one evaluation unit, the at least one evaluation unit being configured to:
      determine a first point in time of a predeterminable steep increase in the current signal,
      form a temporal integral of current values of the current signal from the first point in time to a second point in time,
      compare a pair of values, comprising a relevant value of the integral and the relevant value of the current signal, with at least one predeterminable limiting condition at predeterminable temporal intervals substantially continuously, and
      emit an overcurrent and/or short-circuit signal to an outlet of the overcurrent and/or short-circuit detector if the pair of values exceeds a limiting condition,
   wherein the limiting condition is: $(\int i - y_0)^2/a^2 + (i-x_0)^2/b^2 \leq 1$.

* * * * *